(12) United States Patent
Moon

(10) Patent No.: US 7,796,367 B2
(45) Date of Patent: *Sep. 14, 2010

(54) ELECTROSTATIC DISCHARGE CIRCUIT

(75) Inventor: Jung Eon Moon, Icheon-si (KR)

(73) Assignee: Hynix Semiconductor Inc. (KR)

( * ) Notice: Subject to any disclaimer, the term of this patent is extended or adjusted under 35 U.S.C. 154(b) by 0 days.

This patent is subject to a terminal disclaimer.

(21) Appl. No.: 12/324,814

(22) Filed: Nov. 26, 2008

(65) Prior Publication Data

US 2009/0141415 A1 Jun. 4, 2009

(30) Foreign Application Priority Data

Nov. 29, 2007 (KR) .................. 10-2007-0122994

(51) Int. Cl.
*H02H 9/00* (2006.01)
*H01C 7/12* (2006.01)
*H02H 1/00* (2006.01)
*H02H 1/04* (2006.01)
*H02H 3/22* (2006.01)
*H02H 9/06* (2006.01)

(52) U.S. Cl. ....................... 361/56; 361/118

(58) Field of Classification Search ............... 361/56
See application file for complete search history.

(56) References Cited

U.S. PATENT DOCUMENTS 6,861,680 B2 * 3/2005 Ker et al. .................. 257/199

* cited by examiner

*Primary Examiner*—Stephen W Jackson
*Assistant Examiner*—Dharti H Patel
(74) *Attorney, Agent, or Firm*—Baker & McKenzie LLP

(57) ABSTRACT

An electrostatic discharge circuit includes a trigger section configured to detect voltage drops occurring by an electrostatic current transmitted to first and second voltage lines, and to provide pull-up and pull-down detection voltages, an auxiliary discharge section configured to operate by the pull-up and pull-down detection voltages, and to discharge the electrostatic current introduced through an input/output pad to the first and second voltage lines, a main discharge section configured to operate by the pull-down detection voltage, to electrically connecting the first and second voltage lines, and to discharge the electrostatic current, and a CDM discharge section configured to operate by the pull-down detection voltage, and to discharge the electrostatic current supplied from the input/output pad to an internal circuit.

22 Claims, 4 Drawing Sheets

ELECTROSTATIC DISCHARGE CIRCUIT

CROSS-REFERENCES TO RELATED APPLICATION

The present application claims priority under 35 U.S.C. § 119(a) to Korean application number 10-2007-0122994, filed on Nov. 29, 2007, in the Korean Intellectual Property Office, which is incorporated herein by reference in its entirety as if set forth in full.

BACKGROUND

1. Technical Field

The embodiments described herein relate to a semiconductor device, and more particularly, to an electrostatic discharge circuit of a semiconductor device.

2. Related Art

In general, in order to prevent an internal circuit in a semiconductor device from being damaged by an electrostatic current, an electrostatic discharge circuit is provided between a pad and the internal circuit.

As semiconductor devices become highly integrated and operate at high speeds, the thickness of the gate oxide layer of the elements formed in the internal circuit of the semiconductor device gradually decreases. Accordingly, a thin gate oxide layer may be easily damaged even by a low voltage. Thus, as a difference between the operation voltage of the internal circuit and a breakdown voltage that damages the gate oxide layer formed in the internal circuit decreases, it is difficult to design an electrostatic discharge circuit such that an operation margin can be secured in consideration of static electricity.

FIG. 1 is a schematic circuit diagram of a conventional electrostatic discharge circuit. In FIG. 1, the electrostatic discharge circuit 1 includes an NMOS transistor type diode N1, a PMOS transistor type diode P1, a charged device model (CDM) resistor R2, a CDM NMOS transistor type diode N2, a capacitor C1, a resistor R1, and an NMOS transistor N3 all disposed between an input/output pad (IO) 10 and an internal circuit, such as an input buffer 16.

In the electrostatic discharge circuit 1, when positive static electricity is introduced through the input/output pad 10 and is discharged through a ground voltage pad VSS 14, the PMOS transistor type diode P1 operates as a parasitic diode and transmits the positive static electricity to a power voltage line 17. If the voltage generated at the resistor R1 by the initial alternate current component of the static electricity that passes through the capacitor C1 is higher than the threshold voltage of the NMOS transistor N3, then the NMOS transistor N3 is turned ON and provides a discharge path between the power voltage line 17 and a ground voltage line 19, and the positive static electricity is discharged to the ground voltage pad 14 through the NMOS transistor N3.

When negative static electricity is introduced through the input/output pad 10, the NMOS transistor type diode N1 operates as a parasitic diode and is turned ON. Accordingly, if the voltage generated at the resistor R1 by the initial alternate current component of the static electricity that passes through the capacitor C1 is higher than the threshold voltage of the NMOS transistor N3, then the NMOS transistor N3 is turned ON to provide a discharge path between the power voltage line 17 and the ground voltage line 19, and discharges the negative static electricity. Here, the reference numeral 12 designates a power voltage pad VCC.

While the static electricity introduced through the input/output pad 10 is discharged, in order to prevent the voltage supplied to the input/output pad 10 from increasing and the input buffer 16 as the internal circuit from being damaged, the CMD resistor R2 and the CMD NMOS transistor type diode N2 are provided. The CMD resistor R2 has large resistance value to prevent an electrostatic current from being applied to the input buffer 16, and the CMD NMOS transistor type diode N2 discharges the static electricity that has passed through the CMD resistor R2 not to be transmitted to the input buffer 16.

An operation voltage for driving the electrostatic discharge circuit 1 is substantially high. For example, the NMOS transistor N3, the NMOS transistor type diode N1, and the PMOS transistor type diode P1 have turn-ON voltages of about 6.2V, 8.3V and 8.1V, respectively. Thus, the gate oxide layer of the input buffer 16 is likely to experience breakdown before the static electricity can be discharged. Furthermore, since the electrostatic discharge circuit 1 must be provided for each input/output pad 10, an overall size of a semiconductor device increases due to the presence of the electrostatic discharge circuit 1.

SUMMARY

An electrostatic discharge circuit capable of reducing a size of a semiconductor device and having a low operation voltage are described herein. In one aspect, an electrostatic discharge circuit includes a trigger section configured to detect voltage drops occurring by an electrostatic current transmitted to first and second voltage lines, and to provide pull-up and pull-down detection voltages, an auxiliary discharge section configured to operate by the pull-up and pull-down detection voltages, and to discharge the electrostatic current introduced through an input/output pad to the first and second voltage lines, a main discharge section configured to operate by the pull-down detection voltage, to electrically connecting the first and second voltage lines, and to discharge the electrostatic current, and a CDM discharge section configured to operate by the pull-down detection voltage, and to discharge the electrostatic current supplied from the input/output pad to an internal circuit.

In another aspect, an electrostatic discharge circuit includes a plurality of auxiliary discharge circuits, each corresponding to one of a plurality of input/output pads, configured to discharge static electricity introduced through the input/output pads to first and second voltage lines, a power clamp corresponding to pairs of voltage pads shared by the plurality of input/output pads to cooperate with a corresponding one of the plurality of auxiliary discharge circuits when the static electricity is introduced through at least one of the plurality of input/output pads, and to discharge the static electricity, and a trigger section configured to detect voltage drops that occur by the static electricity transmitted to the first and second voltage lines, and to provide pull-up and pull-down detection voltages to the power clamp and respective ones of the plurality of auxiliary discharge circuits.

These and other features, aspects, and embodiments are described below in the section "Detailed Description."

BRIEF DESCRIPTION OF THE DRAWINGS

Features, aspects, and embodiments are described in conjunction with the attached drawings, in which.

DETAILED DESCRIPTION

Figure 1:
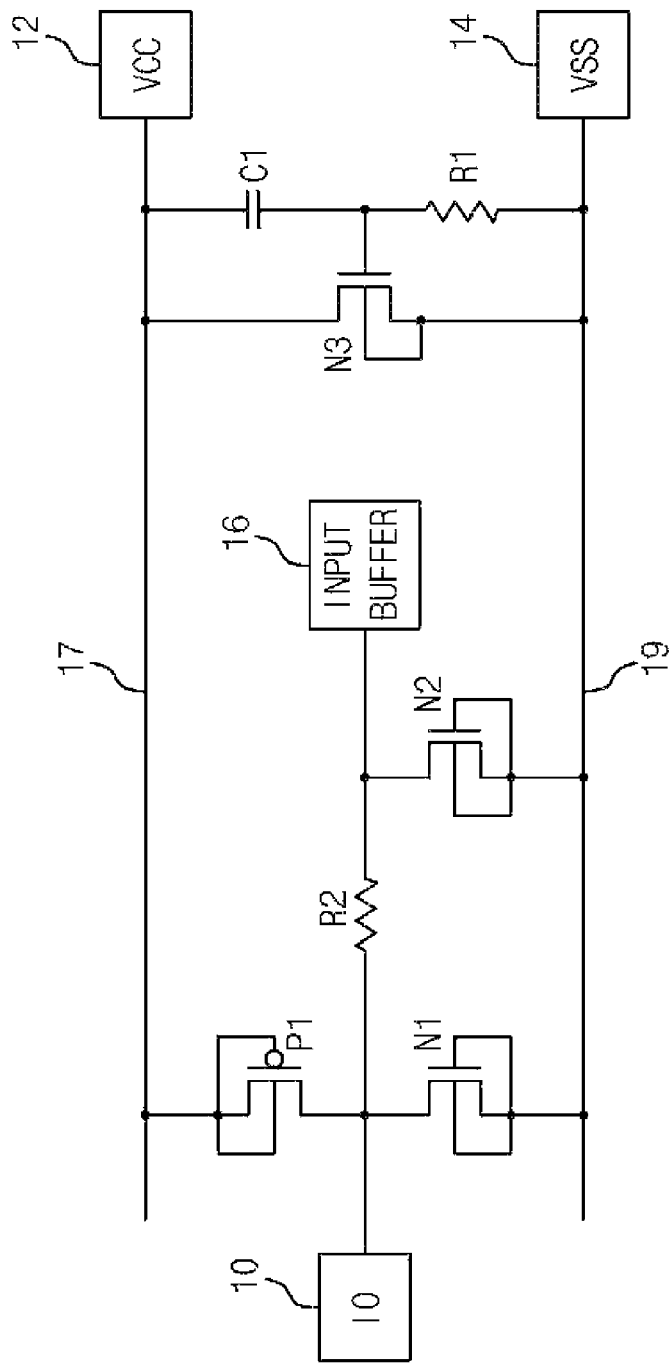
FIG. 1 is a schematic circuit diagram of a conventional electrostatic discharge circuit.
Figure 2:
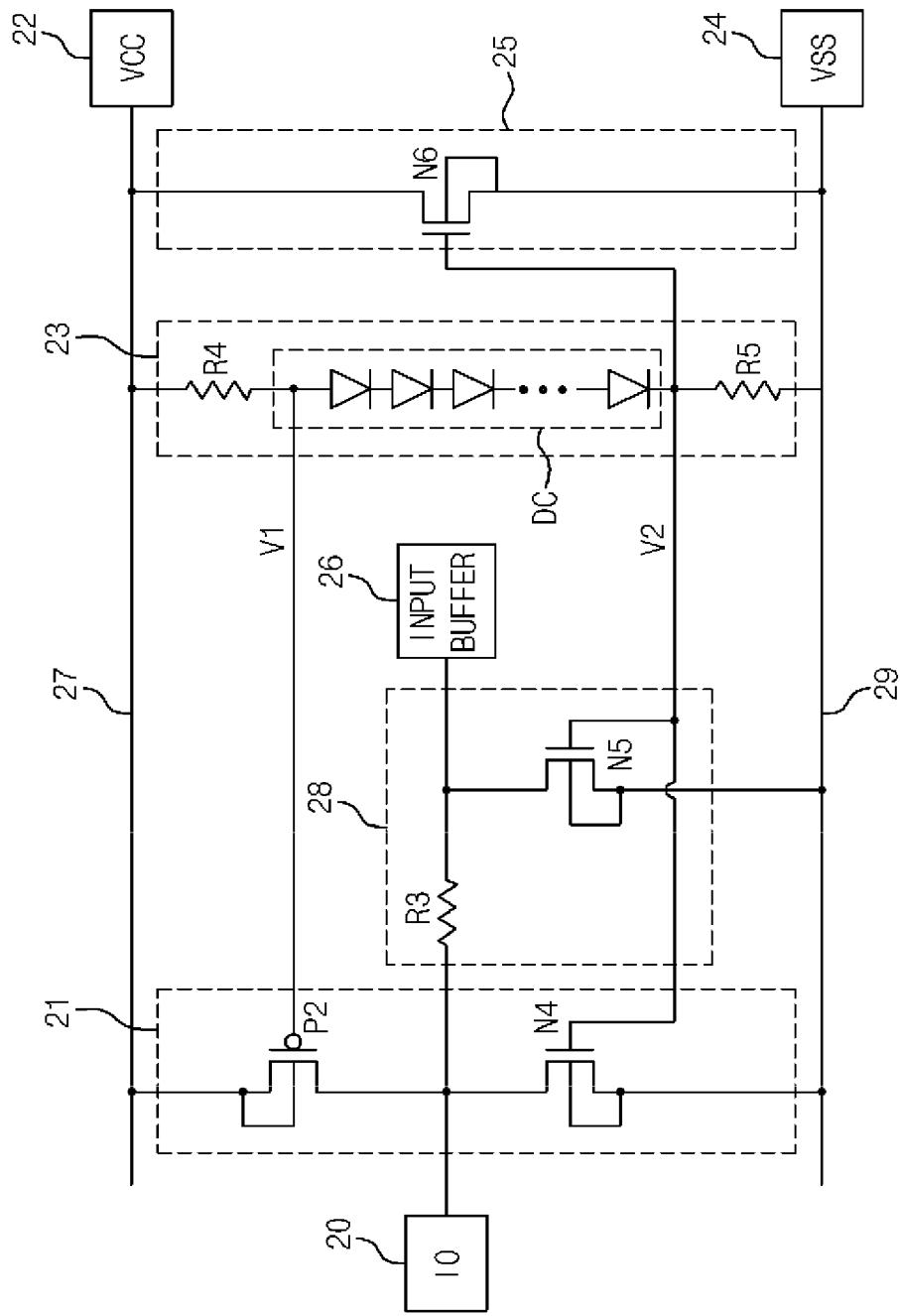
FIG. 2 is a schematic circuit diagram of an exemplary electrostatic discharge circuit according to one embodiment.

FIG. 2 is a schematic circuit diagram of an exemplary electrostatic discharge circuit 2 according to one embodiment. In FIG. 2, an electrostatic discharge circuit 2 can be configured to include an auxiliary discharge section 21, an input/output pad (IO) 20, voltage lines 27 and 29, a trigger section 23, a main discharge section 25, and a CDM discharge section 28. In addition, the electrostatic discharge circuit 2 can include an input buffer 26 that can function as an internal circuit connected to the CDM discharge section 28.

In FIG. 2, the auxiliary discharge section 21 can transmit the electrostatic current, which can be introduced into an input/output pad (IO) 20, to the voltage lines 27 and 29. The trigger section 23 can provide a trigger voltage in response to the initial alternate current component of the electrostatic current transmitted to the voltage lines 27 and 29. The main discharge section 25, which can be driven by the trigger voltage, electrically connects the voltage lines 27 and 29 with each other, and discharges the electrostatic current. The CDM discharge section 28 can discharge the electrostatic current, which can be supplied from the input/output pad 20 to an input buffer 26, to the voltage line 29.

For example, the auxiliary discharge section 21 can include a PMOS transistor P2 that can provide an electrostatic discharge path between the input/output pad 20 and the power voltage line 27, and an NMOS transistor N4 that can provide an electrostatic discharge path between the input/output pad 20 and the ground voltage line 29. In the NMOS and PMOS transistors N4 and P2, source terminals and bulk terminals thereof can be connected with each other, and pull-up and pull-down detection voltages V1 and V2 output from the trigger section 23 can be supplied to gate terminals thereof. Here, the NMOS and PMOS transistors N4 and P2 can be turned ON and OFF depending upon the levels of the voltages supplied to the gate terminals thereof.

In FIG. 2, the trigger section 23 can be configured to include a resistor R4, a diode chain DC, and a resistor R5 connected in series between the power voltage line 27 and the ground voltage line 29. The diode chain DC can include a plurality of diodes D1 through DN (where N is a natural number) connected in series between the resistor R4 and the resistor R5. Here, the number of the diodes should be changed such that the diode chain DC can be turned ON when a voltage higher than the normal operation voltage of a semiconductor device is supplied. In addition, the respective diodes can be connected in the forward bias direction such that cathodes thereof can face the resistor R4 and anodes thereof can face the resistor R5.

The trigger section 23 can provide the respective voltage drops that can occur at the resistors R4 and R5 by the initial alternate current component of the electrostatic current transmitted to the voltage lines 27 and 29 as the pull-up and pull-down detection voltages V1 and V2. In addition, the trigger section 23 can drive the auxiliary discharge section 21, the main discharge section 25, and the CDM discharge section 28.

The main discharge section 25 can be configured to include a clamping circuit having an NMOS transistor N6 connected to the power voltage line 27 and the ground voltage line 29. When the pull-down detection voltage V2 is higher than the threshold voltage of the NMOS transistor N6, the main discharge section 25 can be turned ON to electrically connect the power voltage line 27 and the ground voltage line 29 with each other, and can discharge the electrostatic current.

The CDM discharge section 28 can include a resistor R3 connected to the input/output pad 20 and the input buffer 26, and an NMOS transistor N5 connected to the input buffer 26 and the ground voltage line 29. Here, the resistor R3 can have a large resistance value to prevent the voltage of the input/output pad 20 from increasing and the input buffer 26 from being broken while the static electricity introduced through the input/output pad 20 is discharged to a power voltage pad VCC 22 or a ground voltage pad VSS 24. Furthermore, if the pull-down detection voltage V2 is higher than the threshold voltage of the NMOS transistor N5, then the NMOS transistor N5 can be turned ON to electrically connect the input terminal of the input buffer 26 and the ground voltage line 29, and can discharge the electrostatic current.

An exemplary operation of the electrostatic discharge circuit 2 will be described with reference to FIG. 2.

When positive static electricity is introduced through the input/output pad 20, the PMOS transistor P2 can initially operate as a parasitic diode due to the static electricity instantaneously having a high voltage to allow charges to move along the paths of the drain and well terminals thereof, and can transmit the positive static electricity to the power voltage line 27. Then, the positive static electricity transmitted to the power voltage line 27 can be transmitted to the resistors R4 and R5 and the diode chain DC of the trigger section 23. Next, the trigger section 23 can generate the pull-up detection voltage V1 and the pull-down detection voltage V2 through voltage drops.

If the voltage drop, which can occur as the positive static electricity initially flows through the resistor R5, increases and the pull-down detection voltage V2 increases up to the gate threshold voltage of the NMOS transistor N4, then the MOSFET channel of the NMOS transistor N4 can be opened, and the electrostatic current can be discharged through the NMOS transistor N4 to decrease the voltage of the input/output pad 20.

Simultaneously, the NMOS transistor N5, which can be located in front of the input buffer 26, can also be turned ON to prevent the voltage supplied to the gate terminal of the input buffer 26 from increasing. The NMOS transistor N5 can have a small size and can be protected by the resistor R3 such that a large amount of electrostatic current does not flow therethrough.

Then, as the positive static electricity increases, if the pull-down detection voltage V2 increases up to the threshold voltage of the main discharge section 25 by the resistor R5, then the NMOS transistor N6 can operate to discharge the static electricity. Next, when negative static electricity is introduced through the input/output pad 20, the NMOS transistor N4 can initially operates as a parasitic diode and can be turned ON. Accordingly, the NMOS transistor N4 can transmit the negative static electricity to the ground voltage line 29. Next, the negative static electricity transmitted to the ground voltage line 29 can be transmitted to the resistors R4 and R5 and the diode chain DC of the trigger section 23, thereby causing voltage drops in the trigger section 23.

If the voltage drop that occurs as the negative static electricity initially flows through the resistor R4, i.e., the pull-up detection voltage V1, increases up to the gate threshold voltage of the PMOS transistor P2, then the PMOS transistor P2 can operate to discharge the electrostatic current, thereby reducing the voltage of the input/output pad 20.

Then, as the negative static electricity increases, if the pull-down detection voltage V2 generated by the resistor R5 increases up to the threshold voltage of the main discharge section 25, then the NMOS transistor N6 can operate. Accordingly, paths for discharging the static electricity through the channel of the NMOS transistor N6 and through the parasitic diode of the NMOS transistor N4 can be additionally created.

In the electrostatic discharge circuit 2, since the MOS transistors P2, and N4 through N6 can be driven by the pull-up and pull-down detection voltages V1 and V2 detected by the trigger section 23, the operational voltages of the transistors can be reduced.

Figure 3:
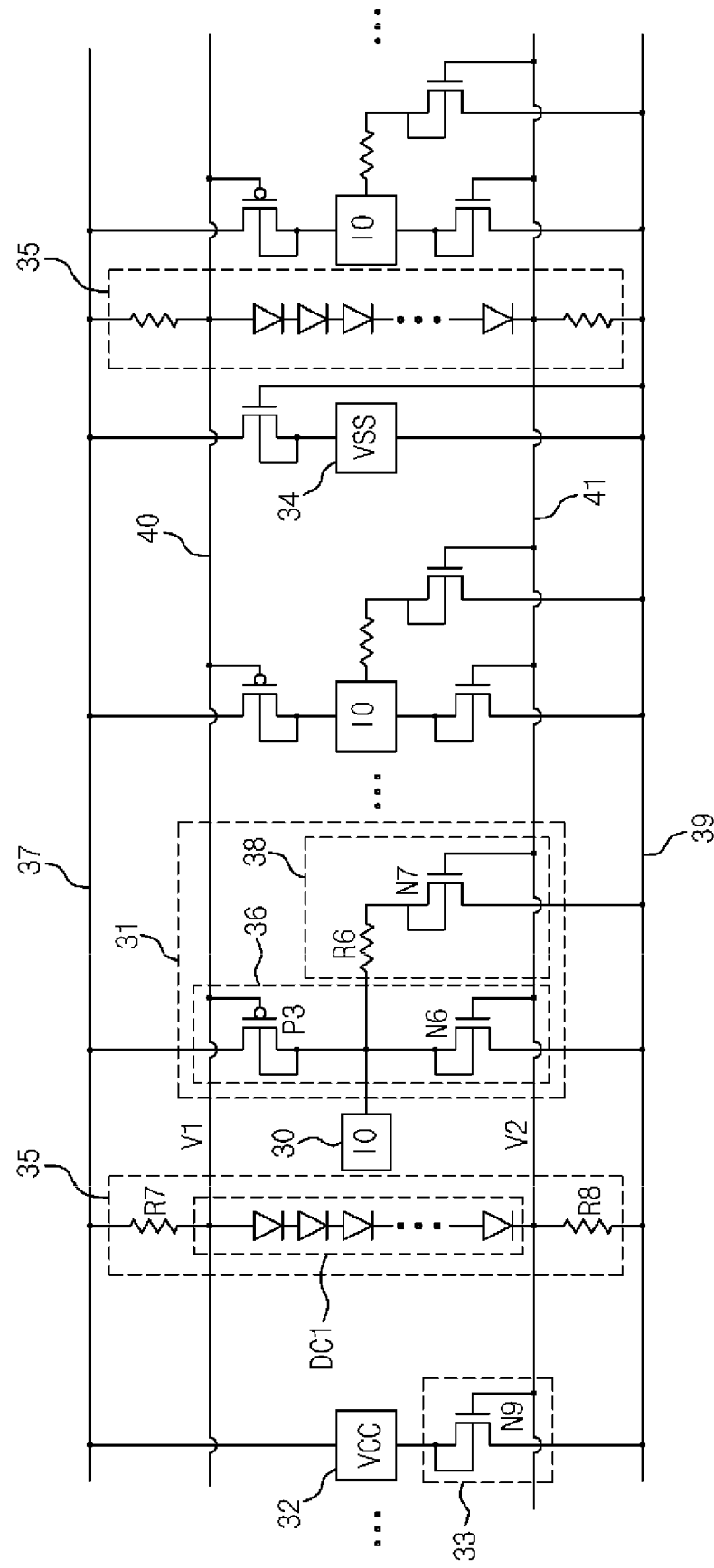
FIG. 3 is a schematic circuit diagram of another exemplary electrostatic discharge circuit according to another embodiment.

FIG. 3 is a schematic circuit diagram of another exemplary electrostatic discharge circuit according to another embodiment. In FIG. 3, an electrostatic discharge circuit 3 can be configured to include a plurality of auxiliary discharge circuits 31, a plurality of input/output pads (IO) 30, a power clamp section 33, a pair of voltage pads VCC and VSS 32 and 34, a trigger section 35, and power lines 37 and 39.

In FIG. 3, the auxiliary discharge circuits 31 can correspond to respective ones of the input/output pads (IO) 30. The power clamp section 33 can correspond to the pair of voltage pads VCC and VSS 32 and 34 shared by the plurality of input/output pads 30, and can cooperate with a corresponding one of the auxiliary discharge circuits 31 to discharge static electricity when the static electricity is introduced through at least one of the plurality input/output pads 30. The trigger section 35 can correspond to each pair of the voltage pads 32 and 34, and can detect voltage drops occurring by the static electricity initially transmitted to the power lines 37 and 39. In addition, the trigger section 35 can provide pull-up and pull-down detection voltages V1 and V2 to the plurality of auxiliary discharge circuits 31 and the power clamp section 33. Here, each of the plurality of auxiliary discharge circuits 31 can include an auxiliary discharge section 36 and a CDM discharge section 38.

The auxiliary discharge section 36 can be configured in substantially the same manner as the auxiliary discharge section 21 (in FIG. 2). For example, the auxiliary discharge section 36 can include a PMOS transistor P3 and an NMOS transistor N7 that can selectively operate by the voltage of the static electricity introduced through the input/output pad 30 to electrically connect the input/output pad 30 with the power voltage line 37 and the ground voltage line 39.

In the NMOS and PMOS transistors N7 and P3, source and bulk terminals thereof can be connected with each other such that each of the NMOS and PMOS transistors N7 and P3 can operate as a parasitic diode and as a MOS transistor depending upon the characteristics of the static electricity supplied thereto. The NMOS and PMOS transistors N7 and P3 can operate when the pull-up and pull-down detection voltages V1 and V2 are higher than the threshold voltages of the NMOS and PMOS transistors N7 and P3.

The CDM discharge section 38 can be configured in substantially the same manner as the CDM discharge section 28 (in FIG. 2). For example, the CDM discharge section 38 can include a resistor R6 connected to the input/output pad 30 and an input buffer (not shown), and an NMOS transistor N8 connected to the input buffer and the ground voltage line 39.

When the pull-down detection voltage V2 is higher than the threshold voltage of the NMOS transistor N8, the NMOS transistor N8 can operate to electrically interconnect the input terminal of the input buffer and the ground voltage line 39 to discharge the electrostatic current.

The power clamp section 33 can include an NMOS transistor N9 connected between the ground voltage line 39 and the power voltage pad 32 when it is operatively associated with the power voltage pad 32. Accordingly, the power clamp section 33 can be connected between the power voltage line 37 and the ground voltage pad 34 when it is operatively associated with the ground voltage pad 34. For example, the power clamp section 33 can operate when the pull-down detection voltage V2 is higher than the gate threshold voltage of the NMOS transistor N9, and can suppress a voltage increase between different kinds of, or the same kind of, power by the static electricity discharged to the respective voltage pads 32 and 34.

The trigger section 35 can be configured in substantially the same manner as the trigger section 23 (in FIG. 2). For example, the trigger section 35 can include resistors R7 and R8 connected to the power voltage line 37 and the ground voltage line 39 and a diode chain DC1 connected between the resistors R7 and R8. The trigger section 35 can detect respective voltage drops that occur in the resistors R7 and R8 by the initial electrostatic current and can provide the pull-up and pull-down detection voltages V1 and V2. Here, the pull-up and pull-down detection voltages V1 and V2 can be provided to the power clamp section 33 and the respective auxiliary discharge circuits 31 through pull-up and pull-down trigger lines 40 and 41, each having a small line width.

The electrostatic discharge circuit 3 can operate in substantially a similar manner to the electrostatic discharge circuit 2 (in FIG. 2). For example, if static electricity is introduced through any one of the input/output pads 30, the power clamp section 33 and the corresponding auxiliary discharge circuit 31 can be driven by the pull-up and pull-down detections voltages V1 and V2 detected in the trigger section 35. As a result, operation voltages can be reduced.

Further, as can be readily seen from FIG. 3, due to the fact that at least two auxiliary discharge circuits 31 share the power clamp section 33 and the trigger section 35, the entire area of the electrostatic discharge circuit can be reduced.

Figure 4:
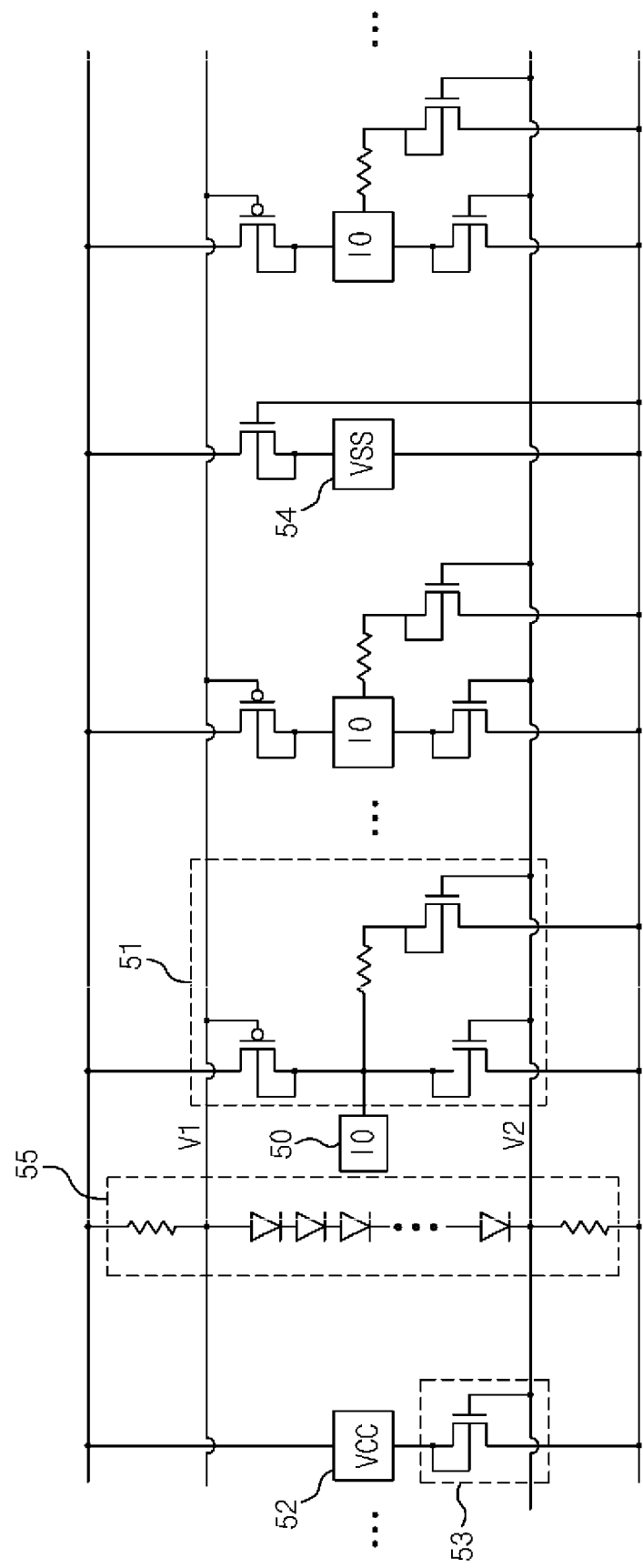
FIG. 4 is a schematic circuit diagram of another exemplary electrostatic discharge circuit according to another embodiment.

FIG. 4 is a schematic circuit diagram of another exemplary electrostatic discharge circuit according to another embodiment. In FIG. 4, a electrostatic discharge circuit 4 can be configured in substantially the same manner as the electrostatic discharge circuit 3 (in FIG. 3). For example, an auxiliary discharge circuit 51 corresponding to each input/output pad 50 can be substantially the same as the auxiliary discharge circuit 31 (in FIG. 3), and a power clamp section 53 corresponding to each pair of voltage pads 52 and 54 can be substantially the same as the power clamp section 33 (in FIG. 3).

The electrostatic discharge circuit 4, unlike the electrostatic discharge circuit 3 (in FIG. 3) having the trigger section 35 corresponding to each pair of voltage pads 32 and 34, can include a plurality of pairs of voltage pads 52 and 54 that can share a trigger section 55 so that the entire area of the electrostatic discharge circuit can be further reduced.

While certain embodiments have been described above, it will I be understood that the embodiments described are by way of example only. Accordingly, the device and methods described herein should not be limited based on the described embodiments. Rather, the device and methods described herein should only be limited in light of the claims that follow when taken in conjunction with the above description and accompanying drawings.

What is claimed is:

1. An electrostatic discharge circuit, comprising:
   a trigger section configured to detect voltage drops occurring by an electrostatic current transmitted to first and second voltage lines, and to provide pull-up and pull-down detection voltages;
   an auxiliary discharge section configured to operate by the pull-up and pull-down detection voltages, and to discharge the electrostatic current introduced through an input/output pad to the first and second voltage lines;

a main discharge section configured to operate by the pull-down detection voltage, to electrically connecting the first and second voltage lines, and to discharge the electrostatic current; and a CDM discharge section configured to operate by the pull-down detection voltage, and to discharge the electrostatic current supplied from the input/output pad to an internal circuit.

2. The electrostatic discharge circuit according to claim 1, wherein the trigger section comprises:

first and second resistors connected to the first and second voltage lines, respectively; and a diode chain having a plurality of diodes connected in series between the first and second resistors.

3. The electrostatic discharge circuit according to claim 2, wherein the number of the diodes connected in series is adjusted such that the diode chain operates at a voltage higher than a normal operation voltage of the internal circuit.

4. The electrostatic discharge circuit according to claim 2, wherein the diodes are connected such that cathodes thereof face the first resistor connected to the first voltage line and anodes thereof face the second resistor connected to the second voltage line.

5. The electrostatic discharge circuit according to claim 2, wherein the trigger section outputs the pull-up detection voltage through a common node between the first resistor and the diode chain, and outputs the pull-down detection voltage through a common node between the second resistor and the diode chain.

6. The electrostatic discharge circuit according to claim 1, wherein the auxiliary discharge section comprises:

a PMOS transistor connected between the input/output pad and the first voltage line operates by the pull-up detection voltage to electrically connect the input/output pad and the first voltage line; and an NMOS transistor connected between the input/output pad and the second voltage line operates by the pull-down detection voltage to electrically connect the input/output pad and the second voltage line.

7. The electrostatic discharge circuit according to claim 6, wherein a source terminal and a bulk terminal of each transistor are connected with each other.

8. The electrostatic discharge circuit according to claim 1, wherein the main discharge section includes an NMOS transistor connected between the first and second voltage lines to operate by the pull-down detection voltage.

9. The electrostatic discharge circuit according to claim 1, wherein the CDM discharge section comprises:

a resistor connected between the input/output pad and the internal circuit; and an NMOS transistor connected between an input terminal of the internal circuit and the second voltage line to operate by the pull-down detection voltage.

10. An electrostatic discharge circuit, comprising:

a plurality of auxiliary discharge circuits, each corresponding to one of a plurality of input/output pads, configured to discharge static electricity introduced through the input/output pads to first and second voltage lines;

a power clamp corresponding to pairs of voltage pads shared by the plurality of input/output pads to cooperate with a corresponding one of the plurality of auxiliary discharge circuits when the static electricity is introduced through at least one of the plurality of input/output pads, and to discharge the static electricity; and a trigger section configured to detect voltage drops that occur by the static electricity transmitted to the first and second voltage lines, and to provide pull-up and pull-down detection voltages to the power clamp and respective ones of the plurality of auxiliary discharge circuits.

11. The electrostatic discharge circuit according to claim 10, wherein each of the plurality of auxiliary discharge circuits comprises:

an auxiliary discharge section configured to operate by the pull-up and pull-down detection voltages, to selectively connect the at least one of the plurality of input/output pads and the first and second voltage lines, and to discharge the static electricity introduced through the at least one of the plurality of input/output pads; and a CDM discharge section configured to operate by the pull-down detection voltage and to discharge the static electricity supplied from the at least one of the plurality of input/output pads to an internal circuit.

12. The electrostatic discharge circuit according to claim 11, wherein the auxiliary discharge section comprises:

a PMOS transistor connected between the at least one of the plurality of input/output pads and the first voltage line to operate by the pull-up detection voltage to electrically interconnect the at least one of the plurality of input/output pads and the first voltage line; and an NMOS transistor connected between the at least one of the plurality of input/output pads and the second voltage line to operate by the pull-down detection voltage to electrically interconnect the at least one of the plurality of input/output pads and the second voltage line.

13. The electrostatic discharge circuit according to claim 11, wherein the CDM discharge section comprises:

a resistor connected between the at least one of the plurality of input/output pads and the internal circuit; and an NMOS transistor connected between an input terminal of the internal circuit and the second voltage line to operate by the pull-down detection voltage.

14. The electrostatic discharge circuit according to claim 10, wherein the power clamp includes an NMOS transistor connected between the voltage pads and one of the first voltage line and the second voltage line to operate by the pull-down detection voltage to discharge the static electricity to the voltage pads.

15. The electrostatic discharge circuit according to claim 14, wherein the NMOS transistor of the power clamp is connected between a ground voltage pad and the first voltage line when the power clamp is operatively associated with the ground voltage pad, and is connected between a power voltage pad and the second voltage line when the power clamp is operatively associated with the power voltage pad.

16. The electrostatic discharge circuit according to claim 10, wherein the trigger section corresponds in a one-to-one relationship with the power clamp.

17. The electrostatic discharge circuit according to claim 10, wherein the trigger section corresponds to a plurality of the power clamp.

18. The electrostatic discharge circuit according to claim 10, wherein the trigger section comprises:

first and second resistors connected to the first and second voltage lines; and a diode chain having a plurality of diodes connected in series between the first and second resistors.

19. The electrostatic discharge circuit according to claim 18, wherein the number of the diodes connected in series is adjusted such that the diode chain operates at a voltage higher than a normal operation voltage of the internal circuit.

20. The electrostatic discharge circuit according to claim 18, wherein the diodes are interconnected such that cathodes thereof face the first resistor connected to the first voltage line and anodes thereof face the second resistor connected to the second voltage line.

21. The electrostatic discharge circuit according to claim 18, wherein the trigger section outputs the pull-up detection voltage through a common node between the first resistor and the diode chain, and the pull-down detection voltage through a common node between the second resistor and the diode chain.

22. The electrostatic discharge circuit according to claim 10, wherein the pull-up and pull-down detection voltages are provided to the power clamp and the auxiliary discharge circuits through pull-up and pull-down trigger lines.

* * * * *